US012668890B2

(12) United States Patent
Ding et al.

(10) Patent No.: US 12,668,890 B2
(45) Date of Patent: Jun. 30, 2026

(54) LOW-TRANSMISSION-LOSS COPPER-BASED COMPOSITE MATERIAL AND PREPARATION METHOD THEREOF, PCB, AND ELECTRONIC COMPONENT

(71) Applicants: SONGSHAN LAKE MATERIALS LABORATORY, Guangdong (CN); ZHONGKE CRYSTAL MATERIALS (DONGGUAN) CO., LIMITED, Guangdong (CN)

(72) Inventors: Zhiqiang Ding, Dongguan (CN); Zhiqiang Zhang, Dongguan (CN); Menglin He, Dongguan (CN); Zhi Huang, Dongguan (CN); Xiangbin Yue, Dongguan (CN); Enge Wang, Dongguan (CN)

(73) Assignees: Songshan Lake Materials Laboratory, Guangdong (CN); Zhongke Crystal Materials (Dongguan) Co., Limited, Guangdong (CN)

( * ) Notice: Subject to any disclaimer, the term of this patent is extended or adjusted under 35 U.S.C. 154(b) by 0 days.

(21) Appl. No.: 18/563,683

(22) PCT Filed: Nov. 23, 2022

(86) PCT No.: PCT/CN2022/133747
§ 371 (c)(1),
(2) Date: Nov. 22, 2023

(87) PCT Pub. No.: WO2024/087283
PCT Pub. Date: May 2, 2024

(65) Prior Publication Data
US 2025/0354294 A1    Nov. 20, 2025

(30) Foreign Application Priority Data

Oct. 27, 2022    (CN) ......................... 202211325984.1

(51) Int. Cl.
*C30B 25/00* (2006.01)
*B32B 15/04* (2006.01)
(Continued)

(52) U.S. Cl.
CPC .............. *C30B 29/02* (2013.01); *B32B 15/04* (2013.01); *B32B 15/043* (2013.01); *B32B 15/08* (2013.01);
(Continued)

(58) Field of Classification Search
CPC ......... C30B 25/00; C30B 29/02; C23C 16/06; C23C 16/26; C23C 16/342; C23C 16/30;
(Continued)

(56) References Cited

U.S. PATENT DOCUMENTS 10,828,869 B2 * 11/2020 Adams .................... C23C 16/26

FOREIGN PATENT DOCUMENTS

CN        203282767        11/2013
CN        204350437 U      5/2015
(Continued)

OTHER PUBLICATIONS

Machine Translation, Liu, et al., CN 112064071A (Dec. 11, 2020). (Year: 2020).*
(Continued)

*Primary Examiner* — Michael E. La Villa
(74) *Attorney, Agent, or Firm* — KDW Firm PLLC

(57) ABSTRACT
The present disclosure relates to the technical field of composite materials, in particular, to a low-transmission-loss copper-based composite material and a preparation method thereof, a PCB, and an electronic component. The low-transmission-loss copper-based composite material comprises: a plurality of lamination units repeatedly stacked in sequence along a preset direction, each lamination unit comprising a conductor layer and an insulation layer cov-
(Continued)

ering a surface of the conductor layer along the preset direction, and wherein the conductor layer comprises a single-crystal copper layer. The low-transmission-loss copper-based composite material provided in the present disclosure can effectively increase the effective area for signal transmission of the low-transmission-loss copper-based composite material, and can effectively reduce the transmission loss of the entire low-transmission-loss copper-based composite material without reducing the surface roughness of the single-crystal copper layer, which facilitates the application of the low-transmission-loss copper-based composite material in high-frequency high-speed signal transmission.

12 Claims, 5 Drawing Sheets

(51) Int. Cl.

| | |
|---|---|
| *B32B 15/08* | (2006.01) |
| *B32B 15/20* | (2006.01) |
| *C23C 16/06* | (2006.01) |
| *C23C 16/26* | (2006.01) |
| *C23C 16/30* | (2006.01) |
| *C23C 16/34* | (2006.01) |
| *C23C 28/00* | (2006.01) |
| *C23C 30/00* | (2006.01) |
| *C25D 3/38* | (2006.01) |
| *C25D 5/50* | (2006.01) |
| *C30B 29/02* | (2006.01) |
| *H05K 1/02* | (2006.01) |
| *H05K 1/03* | (2006.01) |
| *H05K 1/09* | (2006.01) |
| *H05K 3/00* | (2006.01) |
| *H05K 3/02* | (2006.01) |
| *H05K 3/14* | (2006.01) |

(52) U.S. Cl.
CPC .............. *B32B 15/20* (2013.01); *C23C 16/06* (2013.01); *C23C 16/26* (2013.01); *C23C 16/30* (2013.01); *C23C 16/342* (2013.01); *C23C 28/322* (2013.01); *C23C 28/34* (2013.01); *C23C 28/40* (2013.01); *C23C 28/42* (2013.01); *C23C 28/44* (2013.01); *C23C 30/00* (2013.01); *C23C 30/005* (2013.01); *C25D 3/38* (2013.01); *C25D 5/50* (2013.01); *C30B 25/00* (2013.01); *H05K 1/0218* (2013.01); *H05K 1/0242*

(2013.01); *H05K 1/0256* (2013.01); *H05K 1/03* (2013.01); *H05K 1/0306* (2013.01); *H05K 1/09* (2013.01); *H05K 3/00* (2013.01); *H05K 3/022* (2013.01); *H05K 3/146* (2013.01); *H05K 2201/09263* (2013.01); *Y02A 30/00* (2018.01); *Y10T 428/12535* (2015.01); *Y10T 428/12576* (2015.01); *Y10T 428/12625* (2015.01); *Y10T 428/12882* (2015.01); *Y10T 428/12903* (2015.01); *Y10T 428/1291* (2015.01); *Y10T 428/12993* (2015.01); *Y10T 428/24942* (2015.01); *Y10T 428/2495* (2015.01)

(58) Field of Classification Search
CPC ....... C23C 28/322; C23C 28/34; C23C 28/40; C23C 28/42; C23C 28/44; C23C 30/00; C23C 30/005; C25D 5/50; H05K 1/0218; H05K 1/0242; H05K 1/0256; H05K 1/03; H05K 1/0306; H05K 1/09; H05K 3/00; H05K 3/022; H05K 3/146; H05K 2201/09263; Y02A 30/00; B32B 15/04; B32B 15/043; B32B 15/20; B32B 15/08; Y10T 428/12576; Y10T 428/12535; Y10T 428/12625; Y10T 428/12882; Y10T 428/12903; Y10T 428/1291; Y10T 428/12993; Y10T 428/2495; Y10T 428/24942

See application file for complete search history.

(56) References Cited

FOREIGN PATENT DOCUMENTS

| | | | | | |
|---|---|---|---|---|---|
| CN | 108698375 | A | * 10/2018 | ............. | B32B 15/20 |
| CN | 109949964 | A | 6/2019 | | |
| CN | 112064071 | A | * 12/2020 | ........... | C25D 7/0614 |
| CN | 213339709 | | 6/2021 | | |
| CN | 113873750 | A | * 12/2021 | ............. | C23C 28/42 |
| CN | 218735201 | U | 3/2023 | | |
| WO | WO-2016020392 | A2 | * 2/2016 | ........ | H01L 23/3732 |

OTHER PUBLICATIONS

International Search Report and Written Opinion for Application No. PCT/CN2022/133747 dated Jun. 21, 2023.
Chinese First Office Action in CN Application No. 202211325984.1 dated Dec. 27, 2025, 8 pages.

* cited by examiner

LOW-TRANSMISSION-LOSS COPPER-BASED COMPOSITE MATERIAL AND PREPARATION METHOD THEREOF, PCB, AND ELECTRONIC COMPONENT

CROSS-REFERENCE TO RELATED APPLICATION

The present disclosure claims the priority to the Chinese patent application with the filing number 202211325984.1 filed on Oct. 27, 2022 with the China National Intellectual Property Administration and entitled "Low-transmission-loss Copper-based Composite Material and Preparation Method thereof, PCB, and Electronic Component", the contents of which are incorporated herein by reference in entirety.

TECHNICAL FIELD

The present disclosure relates to the technical field of composite materials, in particular, to a low-transmission-loss copper-based composite material and a preparation method thereof, a PCB, and an electronic component.

BACKGROUND ART

A signal layer of printed circuit board (PCB) is a "bridge" for connecting various electronic components with each other. Electrical conductivity and roughness of a conductor material used in the signal layer determine integrity and stability of signal transmission. With the rapid development of information technologies, higher requirements are imposed on transmission quality and transmission speed of signals. In the context of communication technologies such as 5G and 6G, ensuring integrity of high-frequency high-speed signals faces great challenges.

Transmission loss of the signal layer mainly depends on electrical conductivity and surface roughness of the conductor material. An increase in signal frequency leads to an obvious skin effect, and the signal is centralized on a surface of the conductor material for transmission, so that a decrease in an effective area for signal transmission may lead to different degrees of attenuation of the signal.

Due to advantages such as excellent electrical conductivity, wide sources, and low price, the copper material becomes a conductor material commonly used in the signal layer. However, the copper material or copper foil in the related art has relatively high surface roughness and a relatively small effective area for signal transmission, and grain boundaries of the copper material affect the electrical conductivity and signal transmission thereof, then the transmission loss of the signal cannot be effectively reduced, thus greatly limiting the application of the copper material in high-frequency high-speed signal transmission.

SUMMARY

The present disclosure aims at providing a low-transmission-loss copper-based composite material and a preparation method thereof, a PCB, and an electronic component, which is intended to solve the technical problem of relatively high transmission loss of copper material in the related art.

In some embodiments of the present disclosure, the present disclosure provides a low-transmission-loss copper-based composite material, wherein the low-transmission-loss copper-based composite material may include: a plurality of lamination units repeatedly stacked in sequence along a preset direction, each lamination unit including a conductor layer and an insulation layer covering a surface of the conductor layer along the preset direction, and wherein the conductor layer includes a single-crystal copper layer.

In the present disclosure, by providing a plurality of lamination units stacked along the preset direction, and making each lamination unit have the conductor layer (including the single-crystal copper layer) and the insulation layer stacked along the preset direction, an effective area for signal transmission of the low-transmission-loss copper-based composite material can be effectively increased, and the transmission loss of the entire low-transmission-loss copper-based composite material can be effectively reduced without by reducing the surface roughness of the single-crystal copper layer, which is beneficial to the application of the low-transmission-loss copper-based composite material in high-frequency high-speed signal transmission.

In some embodiments of the present disclosure, in each lamination unit, a thickness ratio of the conductor layer to the insulation layer along the preset direction may be (90-95):(5-10).

The above configuration manner not only can sufficiently exert a shielding effect of the insulation layer in the low-transmission-loss copper-based composite material, but also can realize that the low-transmission-loss copper-based composite material has a relatively low transmission loss. If the insulation layer is relatively thick, the transmission loss of the entire low-transmission-loss copper-based composite material will be slightly increased; and if the insulation layer is relatively thin, the insulation layer is likely to be broken down, which is adverse to fully exert a shielding effect of the insulation layer.

In some embodiments of the present disclosure, the number of lamination units may be 5-8.

The number of lamination units is 5-8, which helps to further reduce the transmission loss of the entire low-transmission-loss copper-based composite material on the basis of effectively increasing the effective area for signal transmission of the low-transmission-loss copper-based composite material.

Optionally, a material of the insulation layer may include boron nitride.

A material of the insulation layer includes boron nitride. Boron nitride has relatively good thermal conducting performance and a relatively low thermal expansion coefficient, so that the existence of boron nitride can improve heat dissipation performance of the lamination units and effectively reduce a thermal stress of the entire low-transmission-loss copper-based composite material generated due to heat generation in a signal transmission process, which is also beneficial to increase a binding force between the entire low-transmission-loss copper-based composite material and a dielectric material forming the PCB; besides, boron nitride has a very high dielectric constant ($\varepsilon_r \approx 5$), and the use of boron nitride in combination with structure of the lamination units can increase the effective area for signal transmission, which is beneficial to further reducing the signal transmission loss.

Optionally, surface roughness Rz of the single-crystal copper layer may be 0.2-1 μm.

Surface roughness Rz of the single-crystal copper layer is 0.2-1 μm, which helps to further reduce the transmission loss of the entire low-transmission-loss copper-based composite material.

In some embodiments of the present disclosure, the conductor layer further may include a graphene layer, and the graphene layer and the single-crystal copper layer are stacked along the preset direction.

The above configuration manner is beneficial to further improving the electrical conductivity of the entire low-transmission-loss copper-based composite material on the basis of effectively reducing the transmission loss of the entire low-transmission-loss copper-based composite material.

Optionally, each conductor layer may include one single-crystal copper layer and two graphene layers, and the two graphene layers are respectively located on two opposite sides of the single-crystal copper layer.

The above configuration manner is beneficial to improving the interference resistance of signal transmission of the entire low-transmission-loss copper-based composite material.

Optionally, in each conductor layer, a thickness ratio of the single-crystal copper layer to the graphene layer along the preset direction may be (90-95):(5-10).

The above configuration manner not only can realize that the low-transmission-loss copper-based composite material has a relatively low transmission loss, but also can realize that the low-transmission-loss copper-based composite material has better electrical conductivity.

Optionally, an electrical conducting rate of the conductor layer may be 105-108% IACS.

In some embodiments of the present disclosure, the low-transmission-loss copper-based composite material may have a transmission loss of 0.4-0.9 dB/inch at 20 GHz, and the low-transmission-loss copper-based composite material may have an impedance of 80-85Ω.

The low-transmission-loss copper-based composite material provided in the present disclosure has the transmission loss far lower than transmission loss of about 1.2 dB/inch of single-crystal copper foil, and it is expected to achieve good application of the low-transmission-loss copper-based composite material in high-frequency high-speed signal transmission.

In some other embodiments of the present disclosure, the present disclosure provides a preparation method of a low-transmission-loss copper-based composite material according to some preceding embodiments, wherein the preparation method may include: pressing together the conductor layers and the insulation layers that are stacked along the preset direction.

The low-transmission-loss copper-based composite material formed by pressing together a plurality of conductor layers and a plurality of insulation layers that are stacked along the preset direction has a relatively large effective area for signal transmission and a relatively low transmission loss, which is beneficial to the application of the low-transmission-loss copper-based composite material in high-frequency high-speed signal transmission.

In some embodiments of the present disclosure, the step of pressing together may include: hot-pressing the conductor layers and the insulation layers under a condition of an inert atmosphere, a temperature of 500-1000° C., and a pressure of 10-100 MPa.

Under the above hot-pressing condition, it helps to make the binding force between the conductor layers and the insulation layers stronger, facilitates improving the structural stability of the entire low-transmission-loss copper-based composite material, can effectively reduce interlayer crack caused by subsequent processing, and further weakens influence on the signal integrity.

In some embodiments of the present disclosure, a step of forming the conductor layers and the insulation layers stacked along the preset direction may include: repeating in sequence a step of forming the insulation layer on the conductor layer by means of vapor deposition or coating and a step of forming the conductor layer on the insulation layer by vapor deposition.

In this way, the binding force between the insulation layers and the conductor layers is further improved.

Optionally, a preparation step of the single-crystal copper layer may include: forming the single-crystal copper layer on a substrate having single-crystal graphene on a surface in an atmosphere of mixed gases of argon and hydrogen and under a temperature condition of 800-1065° C., and peeling the single-crystal copper layer from the substrate, wherein in the mixed gases, a volume ratio of the argon to the hydrogen is (10-20):1.

In the above manner of preparing the single-crystal copper layer, the single-crystal copper layer can be allowed to have relatively low roughness Rz, which is beneficial to further reducing the transmission loss of the entire low-transmission-loss copper-based composite material.

Optionally, the preparation step of the single-crystal copper layer may include: forming the single-crystal copper layer by atomic deposition on the substrate in the atmosphere of the mixed gases and under the temperature condition of 800-1065° C., and peeling the single-crystal copper layer from the substrate to obtain the single-crystal copper layer, wherein the substrate is a sapphire substrate having single-crystal graphene on a surface.

Optionally, the preparation step of the single-crystal copper layer may include: electroplating copper on the substrate to form an electroplated copper layer, then performing annealing in the atmosphere of the mixed gases and under the temperature condition of 800-1065° C., to make the electroplated copper layer to be converted into the single-crystal copper layer, and peeling the single-crystal copper layer from the substrate to obtain the single-crystal copper layer, wherein the substrate is a single-crystal copper substrate having single-crystal graphene on a surface.

Optionally, the conductor layer further may include a graphene layer, and the graphene layer and the single-crystal copper layer are stacked along the preset direction; and a preparation method of the graphene layer may include: growing the graphene layer on the single-crystal copper layer by means of chemical vapor deposition.

The above manner of preparing the graphene layer can make the binding force between the graphene layer and the single-crystal copper layer stronger.

In some further embodiments of the present disclosure, the present disclosure provides a PCB, wherein the PCB may include a signal layer; the signal layer has a signal transmission line structure, and a material of the signal transmission line structure is the low-transmission-loss copper-based composite material provided according to some preceding embodiments, and a thickness direction of the signal layer is consistent with the preset direction.

The PCB provided in the present disclosure has a relatively low signal transmission loss, which is beneficial to the application thereof in high-frequency high-speed signal transmission.

Optionally, the PCB further may include a base and a first composite layer and a second composite layer respectively covering two opposite sides of the base in a thickness direction; the first composite layer and the second composite layer each include a first dielectric layer, the signal layer, a second dielectric layer, and a reference layer covering a surface of the base in sequence along the thickness direction of the base.

The above configuration manner is beneficial to improving the stability of the signal transmission and the interference resistance for signal transmission.

Optionally, along an extending direction of the signal transmission line structure, a distance between two opposite end points of the signal transmission line structure in the first composite layer and a distance between two opposite end points of the signal transmission line structure in the second composite layer are different.

The above configuration manner is beneficial to further improving stability and interference resistance of signal transmission of the entire PCB.

In some embodiments of the present disclosure, the signal transmission line structure may have a plurality of connected S-shaped transmission units.

In some embodiments of the present disclosure, a surface width of the signal transmission line structure close to the first dielectric layer may be less than a surface width of the signal transmission line structure close to the second dielectric layer, and along a direction pointing from the first dielectric layer to the second dielectric layer, a section of the signal transmission line structure in a width direction may be of trapezoid.

In some further embodiments of the present disclosure, the present disclosure provides an electronic component, wherein the electronic component may include the above PCB provided in some further embodiments.

The electronic component provided in the present disclosure has a relatively low signal transmission loss and good signal transmission stability and interference resistance, and is well applied to high-frequency high-speed signal transmission.

BRIEF DESCRIPTION OF DRAWINGS

In order to more clearly illustrate technical solutions of embodiments of the present disclosure, drawings which need to be used in the embodiments will be introduced briefly below, and it should be understood that the drawings below merely show some embodiments of the present disclosure, therefore, they should not be considered as limitation to the scope, and a person ordinarily skilled in the art still could obtain other relevant drawings according to these drawings, without using any creative efforts.

Reference signs: 10—low-transmission-loss copper-based composite material; 101—preset direction; 100—lamination unit; 110—conductor layer; 111—single-crystal copper layer; 112—graphene layer; 120—insulation layer; 20—PCB; 201—extending direction; 210—base; 220—first composite layer; 230—second composite layer; 240—first dielectric layer; 250—signal layer; 251—signal transmission line structure; 2511—transmission unit; 260—second dielectric layer; 270—reference layer.

DETAILED DESCRIPTION OF EMBODIMENTS

In order to make the objectives, technical solutions, and advantages of the embodiments of the present disclosure clearer, the technical solutions in the embodiments of the present disclosure will be described below clearly and completely. If no specific conditions are specified in the embodiments, they are carried out under normal conditions or conditions recommended by manufacturers. If manufacturers of reagents or apparatuses used are not specified, they are conventional products commercially available.

Figure 1:
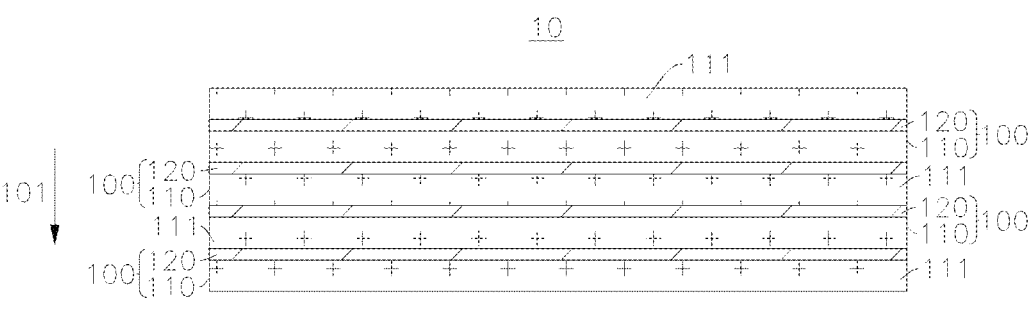
FIG. 1 shows a sectional view of an example of a low-transmission-loss copper-based composite material provided in the present disclosure.

The present disclosure provides a low-transmission-loss copper-based composite material 10. FIG. 1 shows a sectional view of a first example of the low-transmission-loss copper-based composite material 10 provided in the present disclosure. Referring to FIG. 1, the low-transmission-loss copper-based composite material 10 may include: a plurality of lamination units 100 repeatedly stacked in sequence along a preset direction 101, each lamination unit 100 includes a conductor layer 110 and an insulation layer 120 covering a surface of the conductor layer 110 along the preset direction 101, and the conductor layer 110 includes a single-crystal copper layer 111.

In the present disclosure, by providing a plurality of lamination units 100 stacked along the preset direction 101, and making each lamination unit 100 have the insulation layer 120 and the conductor layer 110 (including the single-crystal copper layer 111) stacked along the preset direction 101, an effective area for signal transmission of the low-transmission-loss copper-based composite material 10 can be effectively increased, and the transmission loss of the entire low-transmission-loss copper-based composite material 10 can be effectively reduced without by reducing the surface roughness of the single-crystal copper layer 111. In addition, the single-crystal copper layer 111 has excellent electrical conductivity. The low-transmission-loss copper-based composite material 10 provided in the present disclosure has a good application prospect in high-frequency high-speed signal transmission, and can effectively solve the problem of pain point that current copper materials rely on roughness.

In each lamination unit 100, a thickness ratio of the conductor layer 110 to the insulation layer 120 along the preset direction 101 may be (90-95):(5-10). The above configuration manner not only can sufficiently exert a shielding effect of the insulation layer 120 in the low-transmissionloss copper-based composite material 10, but also can realize that the low-transmission-loss copper-based composite material 10 has a relatively low transmission loss. If the insulation layer 120 is relatively thick, the transmission loss of the entire low-transmission-loss copper-based composite material 10 will be slightly increased; and if the insulation layer 120 is relatively thin, the insulation layer 120 is likely to be broken down, which is adverse to fully exert a shielding effect of the insulation layer 120.

Exemplarily, the thickness ratio of the conductor layer 110 to the insulation layer 120 may be 90:10, 91:9, 92:8, 93:7, 94:6 or 95:5, etc.

Optionally, in some embodiments of the present disclosure, the number of lamination units 100 of the entire low-transmission-loss copper-based composite material 10 may be 5-8, which helps to further reduce the transmission loss of the entire low-transmission-loss copper-based composite material 10 on the basis of effectively increasing the effective area for signal transmission of the low-transmission-loss copper-based composite material 10.

Exemplarily, the number of lamination units 100 of the entire low-transmission-loss copper-based composite material 10 may be 5, 6, 7, 8, or the like.

In some feasible embodiments, a material of the insulation layer 120 may include boron nitride. Boron nitride has relatively good thermal conducting performance and a relatively low thermal expansion coefficient, so that the existence of boron nitride can improve heat dissipation performance of the lamination units 100 and effectively reduce a thermal stress of the entire low-transmission-loss copper-based composite material 10 generated due to heat generation in a signal transmission process, which is also beneficial to increase a binding force between the entire low-transmission-loss copper-based composite material 10 and a dielectric material forming the PCB; besides, boron nitride has a very high dielectric constant ($\varepsilon_r \approx 5$), and the use of boron nitride in combination with structure of the lamination units 100 can increase the effective area for signal transmission, which is beneficial to further reducing the signal transmission loss.

In some feasible embodiments, surface roughness Rz of the single-crystal copper layer 111 may be 0.2-1 μm, which helps to further reduce the transmission loss of the entire low-transmission-loss copper-based composite material 10.

Referring to FIG. 1, in an example, the conductor layer 110 only has the single-crystal copper layer 111, and a top layer and a bottom layer of the entire low-transmission-loss copper-based composite material 10 along the preset direction 101 are both the single-crystal copper layer 111, which, compared with a mode in which the top layer or the bottom layer of the low-transmission-loss copper-based composite material 10 along the preset direction 101 is the insulation layer 120, is beneficial to further increasing the binding force between the low-transmission-loss copper-based composite material 10 and the dielectric material forming the PCB, further improving the structural stability of the entire low-transmission-loss copper-based composite material 10.

Figure 2:
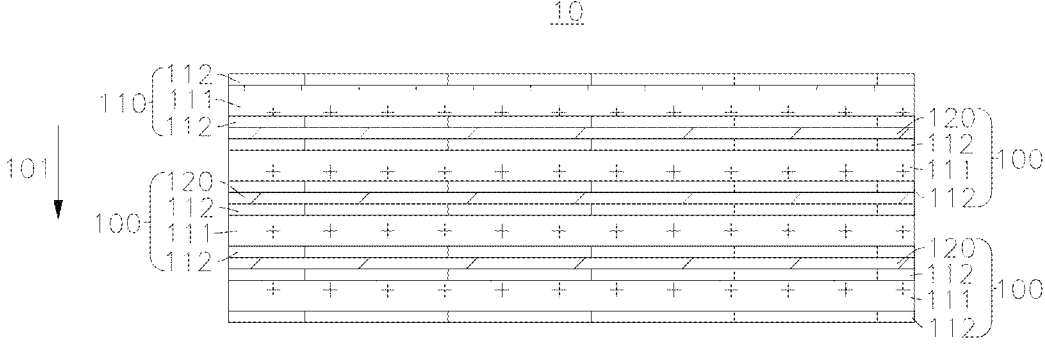
FIG. 2 shows a sectional view of another example of the low-transmission-loss copper-based composite material provided in the present disclosure.

FIG. 2 shows a sectional view of another example of the low-transmission-loss copper-based composite material 10 provided in the present disclosure. Referring to FIG. 2, this another example is different from the foregoing example in that: a graphene layer 112 is further included in the conductor layer 110, and the graphene layer 112 and the single-crystal copper layers 111 are stacked along the preset direction 101 to form the conductor layer 110. The above configuration manner is beneficial to further improving the electrical conductivity of the entire low-transmission-loss copper-based composite material 10 on the basis of effectively reducing the transmission loss of the entire low-transmission-loss copper-based composite material 10.

In some feasible embodiments, each conductor layer 110 may include one single-crystal copper layer 111 and two graphene layers 112, and the two graphene layers 112 are respectively located on two opposite sides of the single-crystal copper layer 111. The above configuration manner is beneficial to improving the interference resistance of signal transmission of the entire low-transmission-loss copper-based composite material 10.

Further optionally, in each conductor layer 110, a thickness ratio of the single-crystal copper layer 111 to the graphene layer 112 along the preset direction 101 may be (90-95):(5-10). The above configuration manner not only can realize that the low-transmission-loss copper-based composite material 10 has a relatively low transmission loss, but also can realize that the low-transmission-loss copper-based composite material 10 has better electrical conductivity (an electrical conducting rate of the conductor layer 110 is 105-108% IACS).

Exemplarily, in each conductor layer 110, the thickness ratio of the single-crystal copper layer 111 to the graphene layer 112 along the preset direction 101 may be 90:10, 91:9, 92:8, 93:7, 94:6, 95:5, or the like.

Referring to FIG. 2, in the foregoing another example, the conductor layer 110 has both the single-crystal copper layer 111 and the graphene layer 112, and the top layer and the bottom layer of the entire low-transmission-loss copper-based composite material 10 along the preset direction 101 are both the graphene layers 112, which, compared with the mode in which the top layer or the bottom layer of the low-transmission-loss copper-based composite material 10 along the preset direction 101 is the insulation layer 120, is beneficial to further increasing the binding force between the low-transmission-loss copper-based composite material 10 and the dielectric material forming the PCB, so as to further improve structural stability of the entire low-transmission-loss copper-based composite material 10.

In the foregoing example, the low-transmission-loss copper-based composite material 10 has the transmission loss of 0.4-0.9 dB/inch at 20 GHz (far lower than transmission loss of about 1.2 dB/inch of single-crystal copper foil), and the low-transmission-loss copper-based composite material 10 has an impedance of 80-85Ω, which is expected to achieve good application of the low-transmission-loss copper-based composite material 10 in high-frequency high-speed signal transmission.

Exemplarily, in some embodiments of the present disclosure, the entire low-transmission-loss copper-based composite material 10 may have a thickness of 1 μm-100 μm, the conductor layer 110 in each lamination unit 100 may have a thickness of (0.9-0.95)-(90-95) μm, and the insulation layer 120 in each lamination unit 100 may have a thickness of (0.05-0.1)-(5-10) μm.

Figure 3:
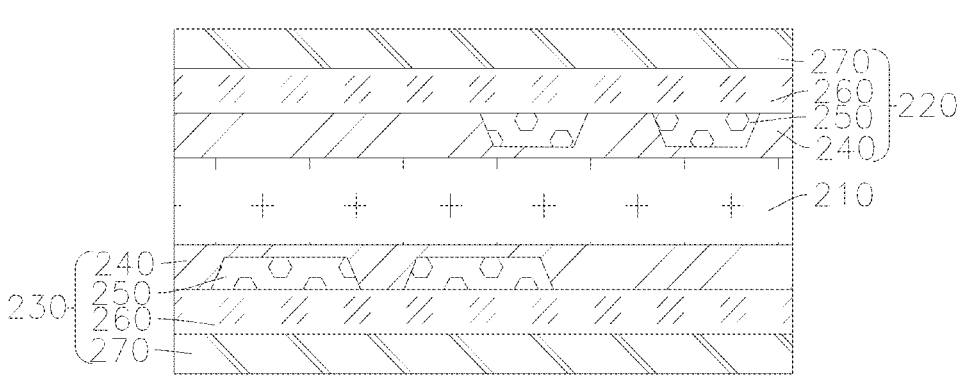
FIG. 3 shows a sectional view of a PCB provided in the present disclosure.

The present disclosure further provides a PCB 20. FIG. 3 shows a sectional view of the PCB 20 provided in the present disclosure. Referring to FIG. 1 to FIG. 3, the PCB 20 may include a signal layer 250; the signal layer 250 has a signal transmission line structure 251, and a material of the signal transmission line structure 251 is the low-transmission-loss copper-based composite material 10; and a thickness direction of the signal layer 250 is consistent with the preset direction 101.

As the signal layer 250 of the PCB 20 provided in the present disclosure adopts the low-transmission-loss copper-based composite material 10 with relatively low transmission loss, it is beneficial to application of the PCB 20 in high-frequency high-speed signal transmission.

Referring to FIG. 3, the PCB 20 further can include a base 210 and a first composite layer 220 and a second composite layer 230 respectively covering two opposite sides of the base 210 in a thickness direction; the first composite layer 220 and the second composite layer 230 each include a first dielectric layer 240, the signal layer 250, a second dielectric layer 260, and a reference layer 270 covering a surface of the base 210 in sequence along the thickness direction of the base 210, and the thickness direction of the base 210 is consistent with the preset direction 101 of the low-transmission-loss copper-based composite material 10 in the signal layer 250. The above configuration manner is beneficial to improving stability of signal transmission and interference resistance of the signal transmission.

Exemplarily, a material of the reference layer 270 may be ordinary copper foil, the reference layer 270 may have a thickness of 10-100 μm, the signal layer 250 may have a thickness of 3-70 μm, materials of the first dielectric layer 240 and the second dielectric layer 260 both may be a composite material of glass fibers and resin, and thicknesses of the first dielectric layer 240 and the second dielectric layer 260 each may be 10-400 μm independently.

Figures 4, 5:
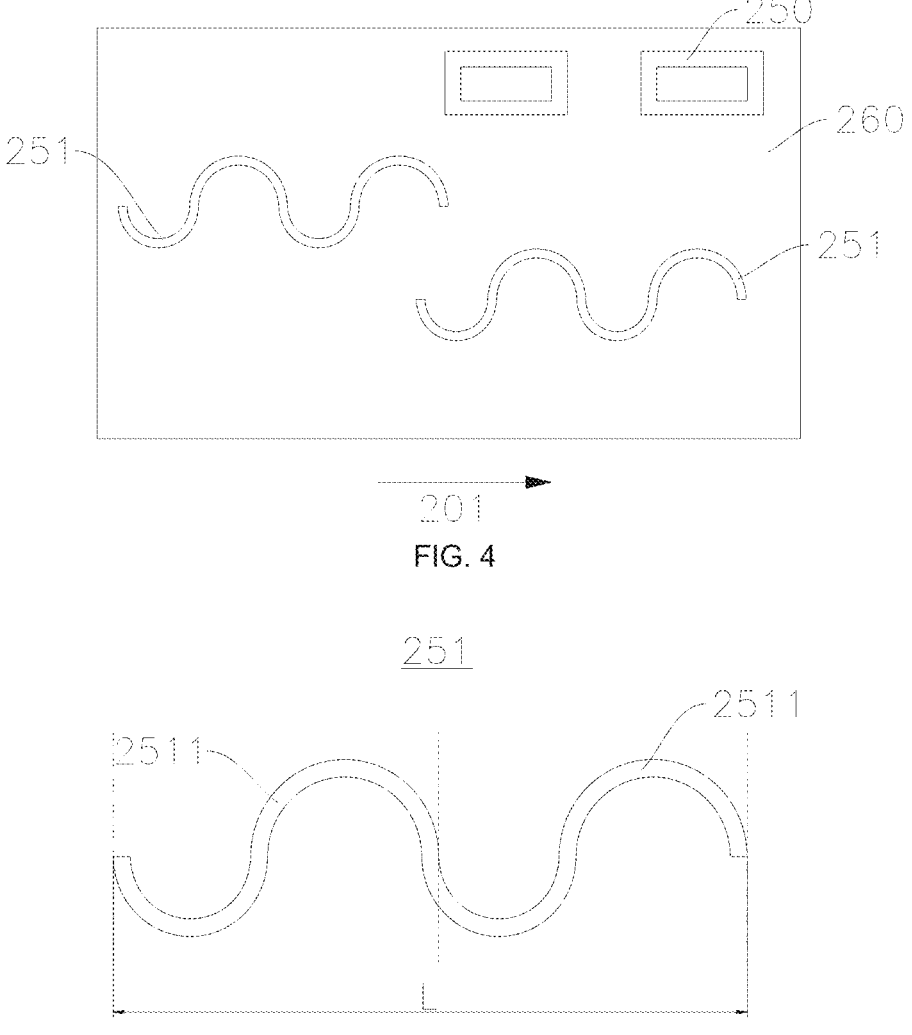
FIG. 4 shows a structural schematic view of a signal layer and a second dielectric layer in the PCB provided in the present disclosure.
FIG. 5 shows a structural schematic view of a signal transmission line structure in the PCB provided in the present disclosure.

FIG. 4 shows a structural schematic view of the signal layer 250 and the second dielectric layer 260 in the PCB 20 provided in the present disclosure, and FIG. 5 shows a structural schematic view of the signal transmission line structure 251 of the PCB provided in the present disclosure. Referring to FIG. 4 and FIG. 5, in some embodiments of the present disclosure, along an extending direction 201 of the signal transmission line structure 251, a distance between two opposite end points of the signal transmission line structure 251 in the first composite layer 220 and a distance between two opposite end points of the signal transmission line structure 251 in the second composite layer 230 may be different. It should be noted that, along the extending direction 201 of the signal transmission line structure 251, the distance between two opposite end points of the signal transmission line structure 251 refers to a distance indicated by L in FIG. 5.

The above configuration manner is beneficial to further improving stability and interference resistance of signal transmission of the entire PCB 20.

Exemplarily, the distance between two opposite end points of the signal transmission line structure 251 in the first composite layer 220 may be 7-10 inches, and the distance between two opposite end points of the signal transmission line structure 251 in the second composite layer 230 may be 12-15 inches.

Optionally, in some feasible embodiments, the signal transmission line structure 251 may have a plurality of connected S-shaped transmission units 2511. It should be noted that, the transmission unit 2511 refers to a structure between two adjacent dotted lines in FIG. 5. Compared with a mode in which the signal transmission line structure 251 is a continuous zigzag transmission unit, the above configuration manner helps to effectively reduce the signal transmission loss of the PCB 20.

Exemplarily, in the present disclosure, a surface width of the signal transmission line structure 251 close to the first dielectric layer 240 may be less than a surface width of the signal transmission line structure 251 close to the second dielectric layer 260, and along a direction pointing from the first dielectric layer 240 to the second dielectric layer 260, a section of the signal transmission line structure 251 in a width direction may be of trapezoid.

Exemplarily, the surface width of the signal transmission line structure 251 close to the first dielectric layer 240 may be 7.5 mil, and the surface width of the signal transmission line structure 251 close to the second dielectric layer 260 may be 7 mil.

The present disclosure further provides an electronic component (not shown in the drawings), and the electronic component may include a PCB 20. The electronic component provided in the present disclosure has a relatively low signal transmission loss and good signal transmission stability and interference resistance, and is well applied to the high-frequency high-speed signal transmission.

The present disclosure further provides a preparation method of a low-transmission-loss copper-based composite material, wherein for a structure of the low-transmission-loss copper-based composite material, reference is made to the above contents, and is not repeated herein. The preparation method of a low-transmission-loss copper-based composite material may include: pressing together a conductor layer and an insulation layer that are stacked along a preset direction.

The low-transmission-loss copper-based composite material prepared in the present disclosure has a relatively large effective area for signal transmission and a relatively low transmission loss, which is beneficial to the application of the low-transmission-loss copper-based composite material in high-frequency high-speed signal transmission.

In some feasible embodiments, the step of pressing together can include: hot-pressing the conductor layer and the insulation layer under a condition of an inert atmosphere, a temperature of 500-1000° C., and a pressure of 10-100 MPa. Under the above hot-pressing condition, it helps to make the binding force between the conductor layers and the insulation layers stronger, facilitates improving the structural stability of the entire low-transmission-loss copper-based composite material, can effectively reduce interlayer crack caused by subsequent processing, and further weakens influence on the signal integrity.

Exemplarily, the inert atmosphere may be selected from argon, nitrogen, or the like; a temperature of the hot-pressing may be 500° C., 550° C., 700° C., 750° C., 800° C., 900° C., 1000° C., or the like; a pressure of the hot-pressing may be 10 MPa, 20 MPa, 30 MPa, 50 MPa, 75 MPa, 90 MPa or 100 MPa, etc.; and time of the hot-pressing may be 30-100 min.

In some feasible embodiments, a step of forming the conductor layer and the insulation layer stacked along the preset direction may include: repeating in sequence a step of forming the insulation layer on the conductor layer by means of vapor deposition or coating and a step of forming the conductor layer on the insulation layer by vapor deposition. In this way, the binding force between the insulation layers and the conductor layers is further improved.

It should be noted that, in other feasible embodiments, the insulation layer also can be formed on the conductor layer in a manner similar to "a manner of transferring graphene". The manner of transferring graphene is as follows: coating PMMA on a boron nitride surface of a copper material grown with boron nitride, then corroding copper, after corroding the copper, transferring a film layer formed by the boron nitride and PMMA onto the conductor layer; and removing the PMMA with acetone, to obtain an insulation layer structure located on the conductor layer.

In some feasible embodiments, a preparation step of the single-crystal copper layer may include: forming the single-crystal copper layer on a substrate having single-crystal graphene on a surface in an atmosphere of mixed gases of argon and hydrogen and under a temperature condition of 800-1065° C., and peeling the single-crystal copper layer from the substrate, wherein in the mixed gases, a volume ratio of argon to hydrogen is (10-20):1. In the above manner of preparing the single-crystal copper layer, the single-crystal graphene has relatively low roughness, and copper has a high lattice matching degree with the single-crystal graphene, so that the copper layer formed on the surface of the single-crystal graphene also may have single-crystal property and relatively low roughness. In addition, the above temperature and the volume ratio of argon to hydrogen can effectively reduce the surface roughness Rz of the prepared single-crystal copper layer, which helps to further reduce the transmission loss of the entire low-transmission-loss copper-based composite material.

Exemplarily, a temperature for forming the single-crystal copper layer may be 800° C., 850° C., 900° C., 920° C., 930° C., 950° C., 970° C., 980° C., 990° C., 1065° C., or the like; and in the mixed gases, the volume ratio of argon to hydrogen may be 10:1, 12:1, 12.5:1, 13:1, 13.5:1, 14:1, 14.5:1, 15:1, 15.5:1, 16:1, 18:1, 20:1 or the like.

In the present disclosure, the preparation step of the single-crystal copper layer can include following steps: forming the single-crystal copper layer by atomic deposition on a substrate in an atmosphere of mixed gases of argon and hydrogen under a temperature condition of 800-1065° C., and peeling the single-crystal copper layer from the substrate to obtain the single-crystal copper layer, wherein the substrate is a sapphire substrate having single-crystal graphene on a surface.

Optionally, when forming the single-crystal copper layer by atomic deposition, a volume ratio of argon to hydrogen may be (13-15):1, and a temperature for forming the single-crystal copper layer may be 900-1000° C.; and under the above condition, it is beneficial to further reducing the surface roughness Rz of the prepared single-crystal copper layer.

Further optionally, when the single-crystal copper layer is formed by atomic deposition, the volume ratio of argon to hydrogen may be 14:1, and the temperature for forming the single-crystal copper layer may be 950° C.; and under the above condition, crystal facets in the formed single-crystal copper are all (111) facets, with relatively high single-crystal quality, and relatively low surface roughness Rz.

Exemplarily, a 6N high-purity copper target material is taken as a copper source in the atomic deposition.

In the present disclosure, the preparation step of the single-crystal copper layer also may use following steps: electroplating copper on a substrate to form an electroplated copper layer, then performing annealing in an atmosphere of mixed gases and under a temperature condition of 800-1065° C., to make the electroplated copper layer to be converted into the single-crystal copper layer, and peeling the single-crystal copper layer from the substrate to obtain the single-crystal copper layer, wherein the substrate is a single-crystal copper substrate having single-crystal graphene on a surface thereof. In the above mode of preparing the single-crystal copper layer, the single-crystal graphene has relatively low roughness, and copper has a high lattice matching degree with the single-crystal graphene, so that the copper layer formed on the surface of the single-crystal graphene also may have single-crystal property and have relatively low roughness. In addition, the above temperature and volume ratio of argon to hydrogen can effectively reduce the surface roughness Rz of the prepared single-crystal copper layer, which helps to further reduce the transmission loss of the entire low-transmission-loss copper-based composite material.

Compared with the manner of converting the electroplated copper layer after being annealed into the single-crystal copper layer, the manner of directly forming the single-crystal copper layer by atomic deposition can further reduce the surface roughness Rz of the prepared single-crystal copper layer, while in cases where the single-crystal copper layer with the same thickness is formed, the manner of atomic deposition takes a relatively long time. Therefore, in the present disclosure, if the thickness of the single-crystal copper layer that needs to be formed is less than or equal to 3 μm, the single-crystal copper layer is formed by means of atomic deposition, and if the thickness of the single-crystal copper layer that needs to be formed is greater than 3 μm, the single-crystal copper layer is formed by means of annealing the electroplated copper layer.

Optionally, when forming the single-crystal copper layer by means of annealing the electroplated copper layer, the volume ratio of argon to hydrogen may be (13-15):1, and a temperature for forming the single-crystal copper layer may be 900-1000° C.; and under the above conditions, it is beneficial to further reducing the surface roughness Rz of the prepared single-crystal copper layer.

Further optionally, when the single-crystal copper layer is formed by annealing the electroplated copper layer, the volume ratio of argon to hydrogen may be 14:1, and a temperature for forming the single-crystal copper layer may be 950° C.; and under the above conditions, crystal faces in the formed single-crystal copper are all (111) facets, with relatively high single-crystal quality, and relatively low surface roughness Rz.

In the foregoing another example of the low-transmission-loss copper-based composite material provided in the present disclosure, the conductor layer further has a graphene layer, and the graphene layer and the single-crystal copper layer are stacked along the preset direction; a preparation method of the graphene layer may include: growing the graphene layer on the single-crystal copper layer by means of chemical vapor deposition. By preparing the graphene layer by means of chemical vapor deposition, the binding force between the graphene layer and the single-crystal copper layer may be stronger, which helps to further improve the structural stability of the entire low-transmission-loss copper-based composite material.

Example 1

The present example provides a low-transmission-loss copper-based composite material, with a structure as follows: the low-transmission-loss copper-based composite material has 6 lamination units stacked in sequence from bottom to top, each lamination unit having one single-crystal copper layer located below and one boron nitride layer located above, wherein each single-crystal copper layer has a thickness of 2.85 μm, each boron nitride layer has a thickness of 0.15 μm, and each single-crystal copper layer has surface roughness Rz of 0.8 μm.

Example 2

The present example provides a low-transmission-loss copper-based composite material, with a structure as follows: the low-transmission-loss copper-based composite material has 6 lamination units stacked in sequence from bottom to top, each lamination unit having one graphene layer, one single-crystal copper layer, and one boron nitride layer stacked in sequence from bottom to top, wherein each graphene layer has a thickness of 0.285 μm, each single-crystal copper layer has a thickness of 2.565 μm, each boron nitride layer has a thickness of 0.15 μm, and each single-crystal copper layer has surface roughness Rz of 0.8 μm.

Example 3

The present example provides a low-transmission-loss copper-based composite material, with a structure as follows: the low-transmission-loss copper-based composite material has 6 lamination units stacked in sequence from bottom to top, each lamination unit having one graphene layer, one single-crystal copper layer, one graphene layer, and one boron nitride layer stacked in sequence from bottom to top, wherein each graphene layer has a thickness of 0.1425 μm, each single-crystal copper layer has a thickness of 2.565 μm, each boron nitride layer has a thickness of 0.15 μm, and each single-crystal copper layer has surface roughness Rz of 0.8 μm.

Example 4

The present example provides a low-transmission-loss copper-based composite material, and Example 4 is different from Example 1 in that: each single-crystal copper layer has a thickness of 2.7 μm, and each boron nitride layer has a thickness of 0.3 μm.

Example 5

The present example provides a low-transmission-loss copper-based composite material, and Example 5 is different from Example 1 in that: each single-crystal copper layer has a thickness of 2.4 μm, and each boron nitride layer has a thickness of 0.6 μm.

Example 6

The present example provides a low-transmission-loss copper-based composite material, and Example 6 is different from Example 1 in that: each single-crystal copper layer has a thickness of 2.94 μm, and each boron nitride layer has a thickness of 0.06 μm.

Example 7

The present example provides a low-transmission-loss copper-based composite material, and Example 7 is different from Example 1 in that: the number of lamination units in the low-transmission-loss copper-based composite material is 5, each single-crystal copper layer has a thickness of 3.42 μm, and each boron nitride layer has a thickness of 0.18 μm.

Example 8

The present example provides a low-transmission-loss copper-based composite material, and Example 8 is different from Example 1 in that: the number of lamination units in the low-transmission-loss copper-based composite material is 2, each single-crystal copper layer has a thickness of 8.55 μm, and each boron nitride layer has a thickness of 0.45 μm.

Example 9

The present example provides a low-transmission-loss copper-based composite material, and Example 9 is different from Example 1 in that: the boron nitride layer is replaced with an epoxy resin layer.

Example 10

The present example provides a low-transmission-loss copper-based composite material, with a structure as follows: the low-transmission-loss copper-based composite material has 6 lamination units stacked in sequence from bottom to top, each lamination unit having one single-crystal copper layer located below and one boron nitride layer located above, wherein each single-crystal copper layer has a thickness of 2.85 μm, and each boron nitride layer has a thickness of 0.15 μm.

The above low-transmission-loss copper-based composite material is prepared by a method as follows:

hot-pressing the single-crystal copper layer and the boron nitride layer stacked in sequence at 1000° C. and 100 MPa for 60 min.

Example 11

The present example provides a low-transmission-loss copper-based composite material, and Example 11 is different from Example 10 in that: a temperature of hot-pressing is 200° C.

Example 12

The present example provides a low-transmission-loss copper-based composite material, and Example 12 is different from Example 10 in that: a pressure of the hot-pressing is 5 MPa.

Comparative Example 1

The present comparative example provides a copper material, wherein surface roughness Rz of the copper material is 0.8 μm, and a thickness of the copper material is 18 μm.

Experimental Example 1

Figure 6:
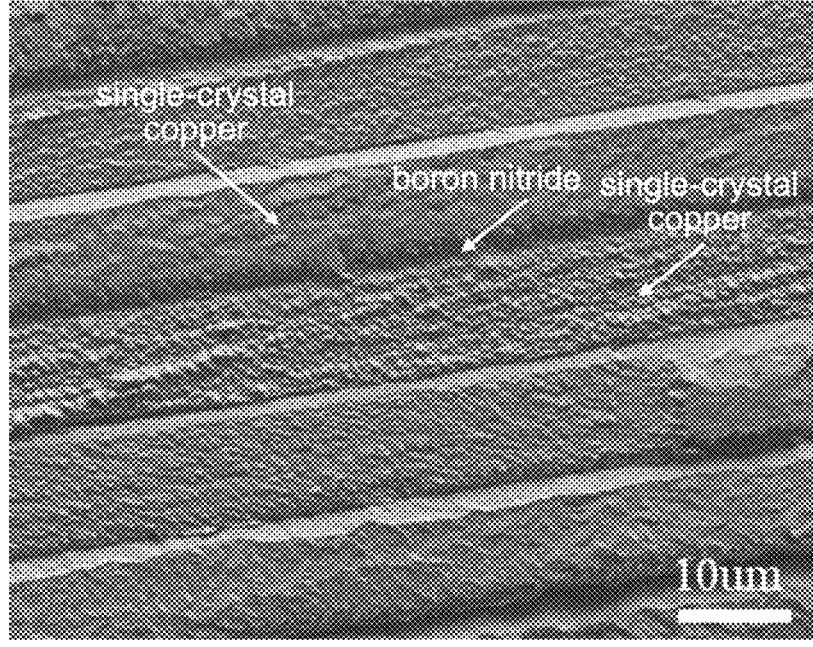
FIG. 6 shows a sectional SEM view of a low-transmission-loss copper-based composite material provided in Example 1 of the present disclosure.
Figure 7:
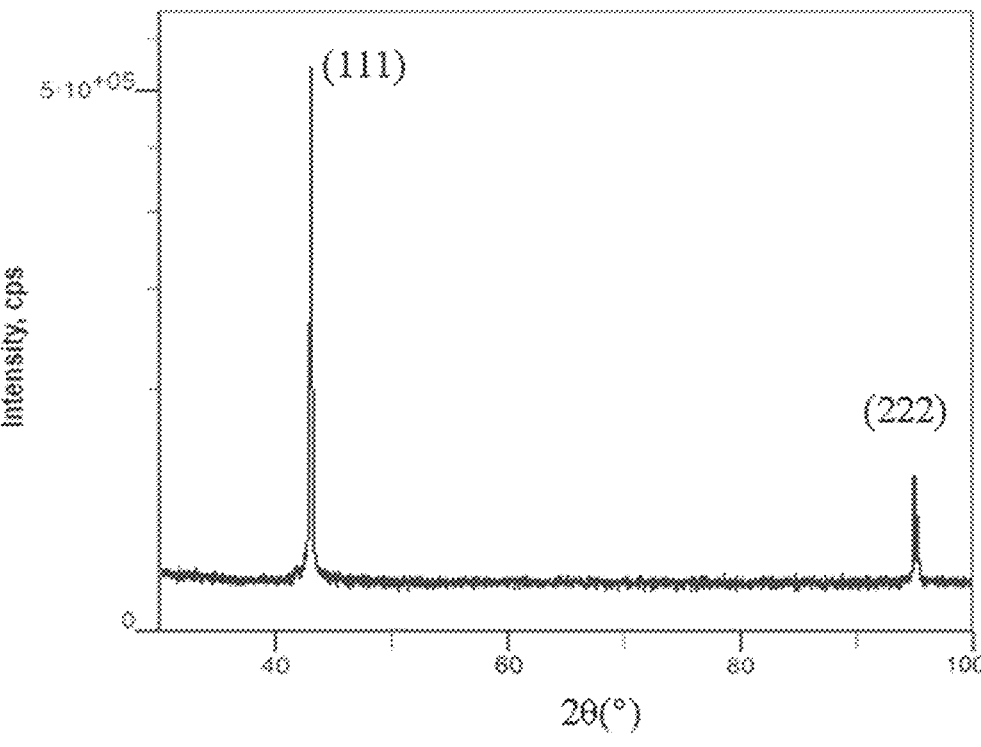
FIG. 7 shows an XRD pattern of a single-crystal copper layer in the low-transmission-loss copper-based composite material provided in Embodiment 1 of the present disclosure.
Figure 8:
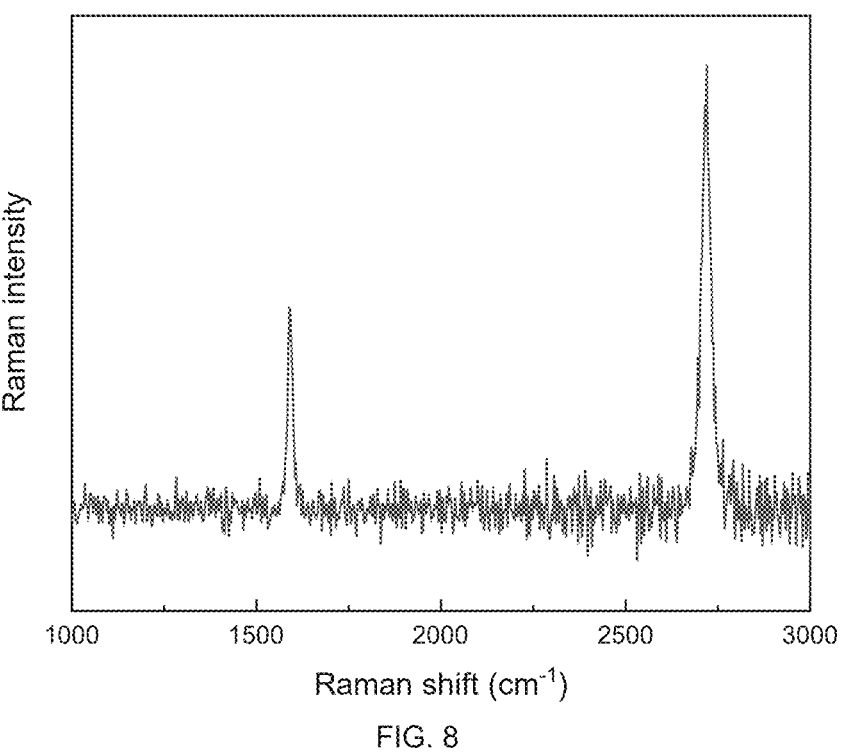
FIG. 8 shows a Raman spectrogram of a single-crystal copper layer in the low-transmission-loss copper-based composite material provided in Example 1 of the present disclosure.
Figure 9:
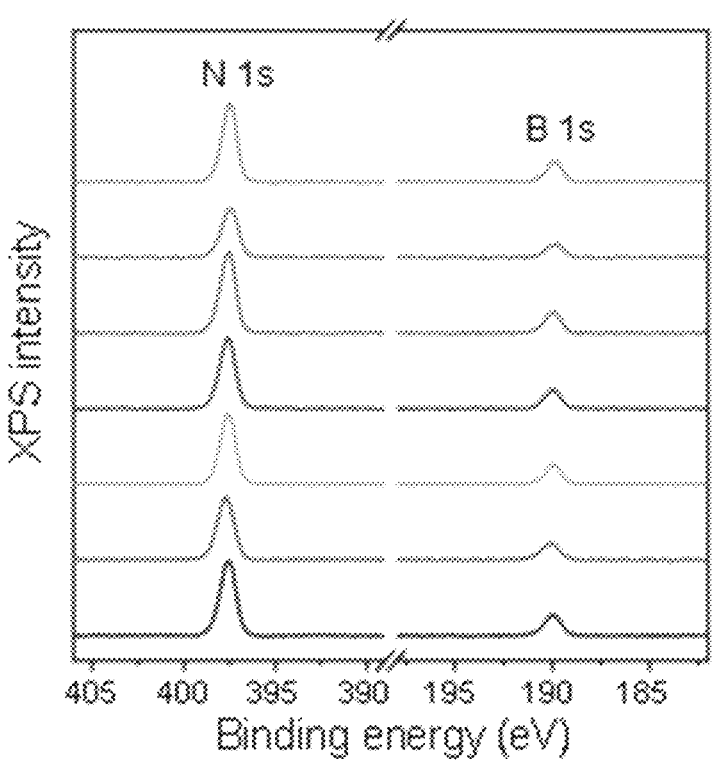
FIG. 9 shows an XPS pattern of a boron nitride layer in the low-transmission-loss copper-based composite material provided in Example 1 of the present disclosure.

SEM characterization was performed on a section of the low-transmission-loss copper-based composite material provided in Example 1 in a thickness direction, and a characterization result is as shown in FIG. 6; and XRD and Raman spectroscopy characterization were performed on the single-crystal copper layer in Example 1, and characterization results are as shown in FIG. 7 and FIG. 8, respectively. XPS characterization was performed on the boron nitride layer in Example 1, and a characterization result is as shown in FIG. 9.

It can be seen from FIG. 6 that a composite lamination structure is formed in the low-transmission-loss copper-based composite material. It can be seen from FIG. 7 and FIG. 8 that the copper layer used in Example 1 is the single-crystal copper layer. As can be seen from FIG. 9, the insulation layer used in Example 1 is a boron nitride layer.

Experimental Example 2

Figure 10:
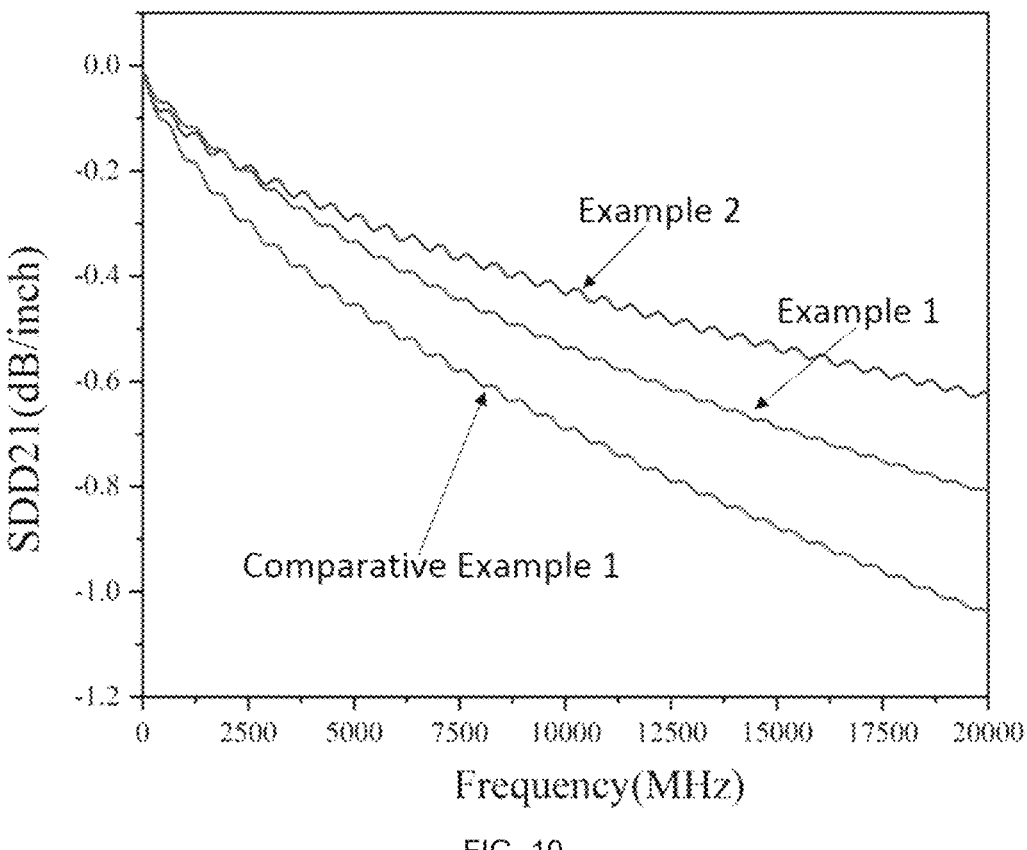
FIG. 10 shows a comparison diagram of transmission loss test of PCBs prepared using copper materials provided in Example 1, Example 2, and Comparative Example 1 of the present disclosure.

The low-transmission-loss copper-based composite materials provided in Example 1 and Example 2 and the copper material provided in Comparative Example 1 were used as a signal layer to prepare PCBs, a vector network analyzer was used to test transmission loss of the separately prepared PCBs, and test results are as shown in FIG. 10. Preparation steps of the PCBs are as follows:

stacking the signal layer, a second dielectric layer, and a reference layer in sequence and then pressing the same together, and then etching the signal layer to obtain a signal transmission line structure, to form a primary composite layer; then covering two surfaces of a copper-clad plate in a thickness direction with the first dielectric layer, then covering a surface of the first dielectric layer away from the copper-clad plate with the primary composite layer, respectively, making the signal layer in contact with the first dielectric layer, and then pressing them together to form the PCB. In the above, a material of the reference layer is ordinary copper foil, the reference layer has a thickness of 18 μm, the signal layer has a thickness of 18 μm, materials of the first dielectric layer and the second dielectric layer are both a composite material of glass fibres and resin, the first dielectric layer has a thickness of 75 μm, and the second dielectric layer has a thickness of 356 μm.

It can be seen from FIG. 10 that the transmission losses of the PCBs prepared using the copper materials provided in Example 2, Example 1, and Comparative Example 1 increase in sequence, indicating that compared with preparing the PCB using only the single-crystal copper layer in Comparative Example 1, the mode of forming the copper-based composite material by stacking and combining a plurality of single-crystal copper layers and a plurality of boron nitride layers in Example 1 and Example 2 can significantly reduce the transmission loss; moreover, the mode of combining the single-crystal copper layer and the graphene layer and then stacking them with the boron nitride can further reduce the transmission loss.

Experimental Example 3

The low-transmission-loss copper-based composite materials provided in Examples 1-9 and the copper material provided in Comparative Example 1 were used to prepare PCBs, a vector network analyzer was used to test transmission loss and impedance of the separately prepared PCBs, and test results are as shown in Table 1. In the above, preparation steps of the PCBs are the same as those in Experimental Example 2.

layer, and the boron nitride layer is used, the transmission loss and the impedance of the copper-based composite material can be further reduced.

By comparing Example 2 and Example 3, it can be seen that in cases where the thickness of the low-transmission-loss copper-based composite material and the number of lamination units are the same, when each lamination unit has one graphene layer, one single-crystal copper layer, one graphene layer, and one boron nitride layer stacked in sequence from bottom to top, the transmission loss and the impedance of the copper-based composite material can be further reduced.

By comparing Example 1 and Examples 4-6, it can be seen that in cases where the thickness of the low-transmission-loss copper-based composite material and the number of lamination units are the same, when the thickness ratio of the single-crystal copper layer to the boron nitride layer is (90-95):(5-10), the transmission loss and the impedance of the copper-based composite material can be further reduced.

By comparing Example 1 and Examples 7-8, it can be seen that in cases where the thickness of the low-transmission-loss copper-based composite material and the thickness of the single-crystal copper layer and the boron nitride layer are the same, the number of lamination units is 5-6, which, compared with the number of lamination units being 2, can further reduce the transmission loss and the impedance of the copper-based composite material.

By comparing Example 1 and Example 9, it can be seen that, compared with the epoxy resin layer, the boron nitride layer can further reduce the transmission loss and the impedance of the copper-based composite material.

Experimental Example 4

The low-transmission-loss copper-based composite materials provided in Examples 10-13 were used to prepare PCBs, a vector network analyzer was used to test transmission loss and impedance of the separately prepared PCBs, and test results are as shown in Table 2. In the above, preparation steps of the PCBs are the same as those in Experimental Example 2.

TABLE 1

| | Transmission loss (20 GHz) (dB/inch) | Impedance (Ω) | | Transmission loss (dB/inch) | Impedance (Ω) |
|---|---|---|---|---|---|
| Example 1 | 0.8 | 82 | Example 6 | 0.88 | 84 |
| Example 2 | 0.6 | 80 | Example 7 | 0.81 | 83 |
| Example 3 | 0.4 | 77 | Example 8 | 0.89 | 84 |
| Example 4 | 0.78 | 83 | Example 9 | 0.93 | 85 |
| Example 5 | 0.9 | 85 | Comparative Example 1 | 1.1 | 85 |

It can be seen from Table 1 that, the transmission loss and the impedance in Examples 1-9 are all lower than those in Comparative Example 1, indicating that in cases where the copper materials have the same thickness, using the copper-based composite material having the lamination structure of the single-crystal copper layer and the boron nitride layer can effectively reduce the transmission loss and the impedance of the copper materials.

By comparing Example 2 and Example 1, it can be seen that in cases where the thickness of the low-transmission-loss copper-based composite material and the number of lamination units are the same, when the lamination unit formed using the single-crystal copper layer, the graphene

TABLE 2

| | Peel strength (N/mm) |
|---|---|
| Example 10 | 0.25 |
| Example 11 | 0.20 |
| Example 12 | 0.17 |

In the above, the peel strength is peel strength between lamination units. It can be seen from Table 2 that, when the single-crystal copper layer and the boron nitride layer stacked in sequence are hot-pressed at 1000° C. and 100 MPa, the peel strength between the lamination units is larger, which is beneficial to further improving the structural stability of the entire low-transmission-loss copper-based composite material.

In conclusion, the low-transmission-loss copper-based composite material provided in the present disclosure can effectively increase the effective area for signal transmission of the low-transmission-loss copper-based composite material, and can effectively reduce the transmission loss of the entire low-transmission-loss copper-based composite material without reducing the surface roughness of the single-crystal copper layer, which facilitates the application thereof in high-frequency high-speed signal transmission.

The above-mentioned are merely for preferred embodiments of the present disclosure and not used to limit the present disclosure, and for one skilled in the art, various modifications and changes may be made to the present disclosure. Any modifications, equivalent substitutions, improvements and so on, within the spirit and principle of the present disclosure, should be covered within the scope of protection of the present disclosure.

INDUSTRIAL APPLICABILITY

The present disclosure relates to the technical field of composite materials, in particular, to a low-transmission-loss copper-based composite material and a preparation method thereof, a PCB, and an electronic component. The low-transmission-loss copper-based composite material includes: a plurality of lamination units repeatedly stacked in sequence along a preset direction, each lamination unit including a conductor layer and an insulation layer covering a surface of the conductor layer along the preset direction, wherein the conductor layer includes a single-crystal copper layer. The low-transmission-loss copper-based composite material provided in the present disclosure can effectively increase the effective area for signal transmission of the low-transmission-loss copper-based composite material, and can effectively reduce the transmission loss of the entire low-transmission-loss copper-based composite material without reducing the surface roughness of the single-crystal copper layer, which facilitates the application of the low-transmission-loss copper-based composite material in high-frequency high-speed signal transmission.

In addition, it could be understood that the low-transmission-loss copper-based composite material and the preparation method thereof, the PCB, and the electronic component in the present disclosure may be reproducible and may be used in various applications. For example, the low-transmission-loss copper-based composite material and the preparation method thereof, the PCB, and the electronic component device in the present disclosure can be used in the technical field of composite materials.

What is claimed is:

1. A low-transmission-loss copper-based composite material, wherein the low-transmission-loss copper-based composite material comprises: a plurality of lamination units repeatedly stacked in sequence along a preset direction, each of the lamination units comprising a conductor layer and an insulation layer covering a surface of the conductor layer along the preset direction, and wherein the conductor layer comprises a single-crystal copper layer; and the low-transmission-loss copper-based composite material has a transmission loss of 0.4-0.9 dB/inch at 20 GHz, and the low-transmission-loss copper-based composite material has an impedance of 80-85 Ω.

2. The low-transmission-loss copper-based composite material according to claim 1, wherein in each of the lamination units, a thickness ratio of the conductor layer to the insulation layer along the preset direction is (90-95):(5-10).

3. The low-transmission-loss copper-based composite material according to claim 2, wherein the number of the lamination units is 5-8;

optionally, a material of the insulation layer comprises boron nitride; and optionally, surface roughness Rz of the single-crystal copper layer is 0.2-1 μm.

4. The low-transmission-loss copper-based composite material according to claim 1, wherein the conductor layer further comprises a graphene layer, and the graphene layer and the single-crystal copper layer are stacked along the preset direction;

optionally, each of the conductor layers comprises one single-crystal copper layer and two graphene layers, and the two graphene layers are respectively located on two opposite sides of the single-crystal copper layer;

optionally, in each of the conductor layers, a thickness ratio of the single-crystal copper layer to the graphene layer along the preset direction is (90-95):(5-10); and optionally, an electrical conducting rate of the conductor layer is 105-108% IACS.

5. A PCB, wherein the PCB comprises a signal layer; the signal layer has a signal transmission line structure, and a material of the signal transmission line structure is the low-transmission-loss copper-based composite material according to claim 1; and a thickness direction of the signal layer is consistent with the preset direction;

optionally, the PCB further comprises a base and a first composite layer and a second composite layer respectively covering two opposite sides of the base in a thickness direction; the first composite layer and the second composite layer each comprise a first dielectric layer, the signal layer, a second dielectric layer, and a reference layer covering a surface of the base in sequence along the thickness direction of the base; and optionally, along an extending direction of the signal transmission line structure, a distance between two opposite end points of the signal transmission line structure in the first composite layer and a distance between two opposite end points of the signal transmission line structure in the second composite layer are different.

6. The PCB according to claim 5, wherein the signal transmission line structure has a plurality of connected S-shaped transmission units.

7. The PCB according to claim 6, wherein a surface width of the signal transmission line structure close to the first dielectric layer is less than a surface width of the signal transmission line structure close to the second dielectric layer, and along a direction pointing from the first dielectric layer to the second dielectric layer, a section of the signal transmission line structure in a width direction is of trapezoid.

8. The PCB according to claim 5, wherein a surface width of the signal transmission line structure close to the first dielectric layer is less than a surface width of the signal transmission line structure close to the second dielectric layer, and along a direction pointing from the first dielectric layer to the second dielectric layer, a section of the signal transmission line structure in a width direction is of trapezoid.

9. A preparation method of the low-transmission-loss copper-based composite material according to claim 1, wherein the preparation method comprises: pressing together a plurality of conductor layers and a plurality of insulation layers that are stacked along the preset direction.

10. The preparation method of the low-transmission-loss copper-based composite material according to claim 9, wherein the step of pressing together comprises: hot-pressing the conductor layers and the insulation layers under a condition of an inert atmosphere, a temperature of 500-1000° C., and a pressure of 10-100 MPa.

11. The preparation method of the low-transmission-loss copper-based composite material according to claim 10, wherein a step of forming the conductor layers and the insulation layers stacked along the preset direction comprises: repeating in sequence a step of forming an insulation layer on a conductor layer by vapor deposition or coating; and a step of forming a conductor layer on an insulation layer by vapor deposition;

optionally, a preparation step of the single-crystal copper layer comprises: forming the single-crystal copper layer on a substrate having single-crystal graphene on a surface in an atmosphere of mixed gases of argon and hydrogen and under a temperature condition of 800-1065° C., and peeling the single-crystal copper layer from the substrate, wherein in the mixed gases, a volume ratio of the argon to the hydrogen is (10-20):1;

optionally, the preparation step of the single-crystal copper layer comprises: forming the single-crystal copper layer by atomic deposition on the substrate in the atmosphere of the mixed gases and under the temperature condition of 800-1065° C., and peeling the single-crystal copper layer from the substrate to obtain the single-crystal copper layer, wherein the substrate is a sapphire substrate having single-crystal graphene on a surface;

optionally, the preparation step of the single-crystal copper layer comprises: electroplating copper on the substrate to form an electroplated copper layer, then performing annealing in the atmosphere of the mixed gases and under the temperature condition of 800-1065° C., to make the electroplated copper layer to be converted into the single-crystal copper layer, and peeling the single-crystal copper layer from the substrate to obtain the single-crystal copper layer, wherein the substrate is a single-crystal copper substrate having single-crystal graphene on a surface; and optionally, the conductor layer further comprises a graphene layer, and the graphene layer and the single-crystal copper layer are stacked along the preset direction; and a preparation method of the graphene layer comprises: growing the graphene layer on the single-crystal copper layer by chemical vapor deposition.

12. The preparation method of the low-transmission-loss copper-based composite material according to claim 9, wherein a step of forming the conductor layers and the insulation layers stacked along the preset direction comprises: repeating in sequence a step of forming an insulation layer on a conductor layer by vapor deposition or coating; and a step of forming a conductor layer on an insulation layer by vapor deposition;

optionally, a preparation step of the single-crystal copper layer comprises: forming the single-crystal copper layer on a substrate having single-crystal graphene on a surface in an atmosphere of mixed gases of argon and hydrogen and under a temperature condition of 800-1065° C., and peeling the single-crystal copper layer from the substrate, wherein in the mixed gases, a volume ratio of the argon to the hydrogen is (10-20):1;

optionally, the preparation step of the single-crystal copper layer comprises: forming the single-crystal copper layer by atomic deposition on the substrate in the atmosphere of the mixed gases and under the temperature condition of 800-1065° C., and peeling the single-crystal copper layer from the substrate to obtain the single-crystal copper layer, wherein the substrate is a sapphire substrate having single-crystal graphene on a surface;

optionally, the preparation step of the single-crystal copper layer comprises:

electroplating copper on the substrate to form an electroplated copper layer, then performing annealing in the atmosphere of the mixed gases and under the temperature condition of 800-1065° C., to make the electroplated copper layer to be converted into the single-crystal copper layer, and peeling the single-crystal copper layer from the substrate to obtain the single-crystal copper layer, wherein the substrate is a single-crystal copper substrate having single-crystal graphene on a surface; and optionally, the conductor layer further comprises a graphene layer, and the graphene layer and the single-crystal copper layer are stacked along the preset direction; and a preparation method of the graphene layer comprises: growing the graphene layer on the single-crystal copper layer by chemical vapor deposition.

* * * * *